(12) United States Patent
Kuusisto et al.

(10) Patent No.: US 10,330,731 B2
(45) Date of Patent: Jun. 25, 2019

(54) POWER AND CURRENT ESTIMATION FOR BATTERIES

(71) Applicant: VOLVO CAR CORPORATION, Gothenburg (SE)

(72) Inventors: Hannes Kuusisto, Gothenburg (SE); Bjorn Fridholm, Gothenburg (SE); Torsten Wik, Gothenburg (SE)

(73) Assignee: Volvo Car Corporation, Gothenburg (SE)

( * ) Notice: Subject to any disclaimer, the term of this patent is extended or adjusted under 35 U.S.C. 154(b) by 239 days.

(21) Appl. No.: 14/932,014

(22) Filed: Nov. 4, 2015

(65) Prior Publication Data
US 2016/0131714 A1 May 12, 2016

(30) Foreign Application Priority Data
Nov. 7, 2014 (EP) .................................... 14192282

(51) Int. Cl.
*G01R 31/367* (2019.01)
*G01R 31/36* (2019.01)
(Continued)

(52) U.S. Cl.
CPC .......... *G01R 31/3648* (2013.01); *B60L 58/12* (2019.02); *G01R 31/367* (2019.01);
(Continued)

(58) Field of Classification Search
CPC .................................................. G01R 31/3651
(Continued)

(56) References Cited

U.S. PATENT DOCUMENTS 5,929,594 A * 7/1999 Nonobe ............... B60L 11/1881
320/104
8,415,954 B2 * 4/2013 Akamine ............. G01R 31/361
320/132
(Continued)

FOREIGN PATENT DOCUMENTS

CN 102914745 A 2/2013
WO 2013163916 A1 11/2013

OTHER PUBLICATIONS

European Search Report for European Application No. 14192282, Completed by the European Patent Office on May 8, 2015, 5 Pages.
(Continued)

*Primary Examiner* — Michael T Tran
(74) *Attorney, Agent, or Firm* — Brooks Kushman P.C.

(57) ABSTRACT

A method and a system are provided for determining a maximum charge current or a maximum discharge current of an energy storage cell of an energy storage device. The method includes providing a predetermined upper voltage limit or lower voltage limit, and providing a time horizon as a time difference from a present time to a future time. The method also include, with a repetition time period different from the time horizon, repeating measuring a present voltage level of the energy storage cell, calculating a voltage difference between the present voltage level and the upper voltage limit or the lower voltage limit, and determining the maximum charge current or maximum discharge current corresponding to the voltage difference and a model, such that the estimated voltage is within the voltage limits.

13 Claims, 9 Drawing Sheets

(51) Int. Cl.
*H01M 10/48* (2006.01)
*G01R 31/382* (2019.01)
*B60L 58/12* (2019.01)
*H01M 10/42* (2006.01)

(52) U.S. Cl.
CPC ........ *G01R 31/382* (2019.01); *H01M 10/482* (2013.01); *H01M 2010/4271* (2013.01); *H01M 2220/20* (2013.01); *Y02T 10/705* (2013.01); *Y02T 10/7005* (2013.01); *Y02T 10/7044* (2013.01)

(58) Field of Classification Search
USPC .................................................... 702/63, 58
See application file for complete search history.

(56) References Cited

U.S. PATENT DOCUMENTS

| | | | |
|---|---|---|---|
| 8,466,684 B2 | 6/2013 | Melichar | |
| 8,718,988 B2 | 5/2014 | Bohlen et al. | |
| 8,935,043 B2* | 1/2015 | Li | B60L 3/12 320/132 |
| 9,197,078 B2* | 11/2015 | Lee | H02J 7/0013 |
| 9,316,697 B2* | 4/2016 | Oh | G01R 31/3624 |
| 9,377,512 B2* | 6/2016 | Frost | G01R 31/3606 |
| 2001/0000423 A1* | 4/2001 | Fischer | H02J 7/0008 320/114 |
| 2002/0098859 A1* | 7/2002 | Murata | H04W 52/0277 455/522 |
| 2003/0227390 A1* | 12/2003 | Hung | G01R 31/3648 340/636.1 |
| 2004/0124810 A1* | 7/2004 | Smallwood | H02J 7/0077 320/128 |
| 2004/0202900 A1* | 10/2004 | Pavio | H01M 8/04447 429/9 |
| 2004/0222768 A1* | 11/2004 | Moore | H02J 7/0075 320/128 |
| 2004/0263119 A1* | 12/2004 | Meyer | H02J 7/0004 320/116 |
| 2005/0017684 A1* | 1/2005 | Brecht | H01M 10/44 320/131 |
| 2005/0110498 A1 | 5/2005 | Plett | |
| 2005/0200331 A1* | 9/2005 | Patino | H02J 7/045 320/128 |
| 2005/0252546 A1* | 11/2005 | Sasaki | H02J 7/35 136/243 |
| 2005/0271941 A1* | 12/2005 | Bushong | H01M 2/1686 429/218.1 |
| 2006/0087291 A1 | 4/2006 | Yamauchi | |
| 2006/0098390 A1* | 5/2006 | Ashtiani | B60K 6/28 361/502 |
| 2006/0113962 A1* | 6/2006 | Spiridon | H02J 7/0093 320/139 |
| 2007/0145953 A1 | 6/2007 | Asai et al. | |
| 2008/0025721 A1* | 1/2008 | Wynman | H04J 3/14 398/38 |
| 2009/0104517 A1* | 4/2009 | Yuasa | H01M 4/505 429/158 |
| 2009/0128096 A1* | 5/2009 | Nunomaki | H01M 10/48 320/136 |
| 2010/0001870 A1* | 1/2010 | Hong | G01R 31/3606 340/636.1 |
| 2010/0145643 A1* | 6/2010 | Katpelly | G06F 1/3203 702/63 |
| 2010/0299548 A1* | 11/2010 | Chadirchi | G06F 1/263 713/340 |
| 2011/0029265 A1* | 2/2011 | Martens | G01R 31/3679 702/63 |
| 2011/0109273 A1 | 5/2011 | Tamezane | |
| 2011/0227414 A1* | 9/2011 | Fischer | H02J 7/0019 307/66 |
| 2012/0139491 A1* | 6/2012 | Eberhard | H02J 7/0016 320/118 |
| 2012/0143585 A1* | 6/2012 | Barsukov | G01R 31/367 703/18 |
| 2012/0187774 A1* | 7/2012 | Tabatabaei | H02J 7/0019 307/109 |
| 2012/0306655 A1* | 12/2012 | Tan | G01R 31/3651 340/636.1 |
| 2013/0026970 A1* | 1/2013 | Gale | H01M 10/4207 320/104 |
| 2013/0069662 A1* | 3/2013 | Tanabe | G01R 31/3658 324/434 |
| 2013/0214606 A1* | 8/2013 | Hasebe | G03G 15/5004 307/80 |
| 2013/0257377 A1* | 10/2013 | Diamond | G01R 31/362 320/118 |
| 2013/0338952 A1* | 12/2013 | Li | H02J 1/10 702/64 |
| 2013/0342342 A1* | 12/2013 | Sabre | G09F 13/18 340/509 |
| 2014/0012426 A1* | 1/2014 | Funakubo | H02J 3/32 700/286 |
| 2014/0042828 A1* | 2/2014 | Itagaki | B60L 3/0046 307/130 |
| 2014/0047248 A1* | 2/2014 | Heo | H02J 7/0068 713/300 |
| 2014/0095091 A1* | 4/2014 | Moore | H04Q 9/00 702/63 |
| 2014/0111141 A1* | 4/2014 | Chan | H02J 7/34 320/107 |
| 2014/0114595 A1 | 4/2014 | Wickert et al. | |
| 2015/0077126 A1* | 3/2015 | Wang | H01M 10/44 324/428 |
| 2015/0084602 A1* | 3/2015 | Sawyers | H01M 10/46 320/134 |
| 2015/0127425 A1* | 5/2015 | Greene | G06Q 30/0202 705/7.31 |
| 2015/0198989 A1* | 7/2015 | Hayter | G06F 1/266 713/340 |
| 2015/0303728 A1* | 10/2015 | Miura | H01M 10/48 320/119 |
| 2015/0336468 A1* | 11/2015 | Sugiyama | B60L 11/1864 701/22 |
| 2016/0003918 A1* | 1/2016 | Wada | H02J 3/32 320/134 |
| 2016/0103181 A1* | 4/2016 | Wang | G01R 31/392 702/63 |
| 2016/0131720 A1* | 5/2016 | Baba | G01R 35/005 702/63 |
| 2016/0146894 A1* | 5/2016 | Teng | G01R 31/3842 702/63 |
| 2016/0161565 A1* | 6/2016 | Wade | G01R 31/392 702/63 |
| 2016/0178678 A1* | 6/2016 | Pelletier | H02J 3/32 705/39 |
| 2016/0181833 A1* | 6/2016 | Araki | H01M 10/44 320/134 |
| 2016/0187430 A1* | 6/2016 | Ma | G01R 31/367 702/63 |
| 2016/0252582 A1* | 9/2016 | Iida | H01M 10/48 702/63 |
| 2016/0253852 A1* | 9/2016 | Bertness | B60L 3/0046 702/63 |
| 2016/0377684 A1* | 12/2016 | Leirens | B60L 3/12 702/63 |
| 2017/0234933 A9* | 8/2017 | Milios | H01M 10/425 429/7 |

OTHER PUBLICATIONS

The State Intellectual Property Office of People's Republic of China, First Search for corresponding Chinese Patent Application No. 201511035742.9, dated Mar. 24, 2019 (per USPTO Global Dossier).
The State Intellectual Property Office of People's Republic of China, First Office Action for corresponding Chinese Patent Appli-

(56) References Cited

OTHER PUBLICATIONS cation No. 201511035742.9, dated Mar. 28, 2019 (per USPTO Global Dossier).

* cited by examiner

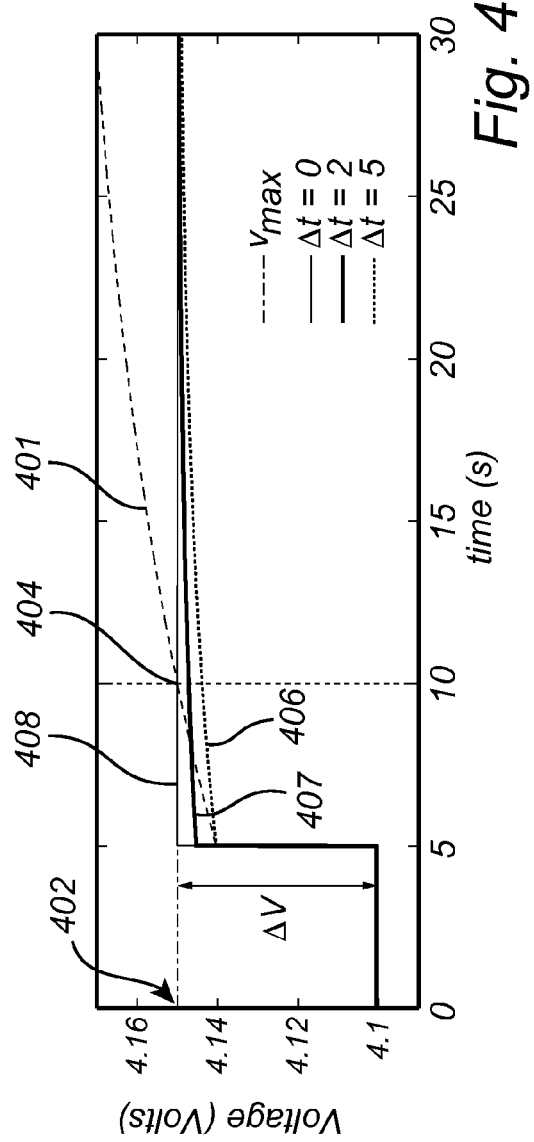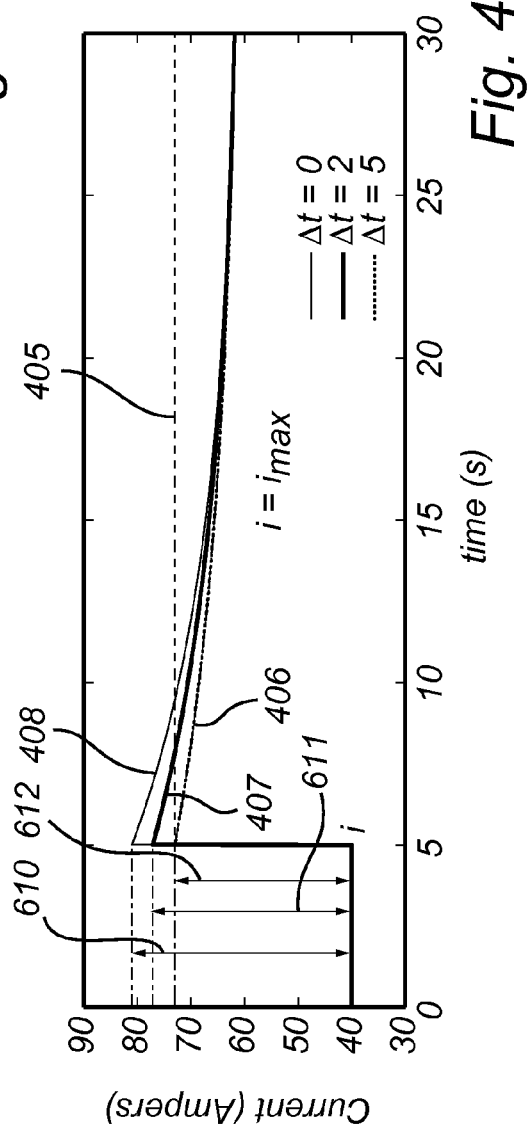

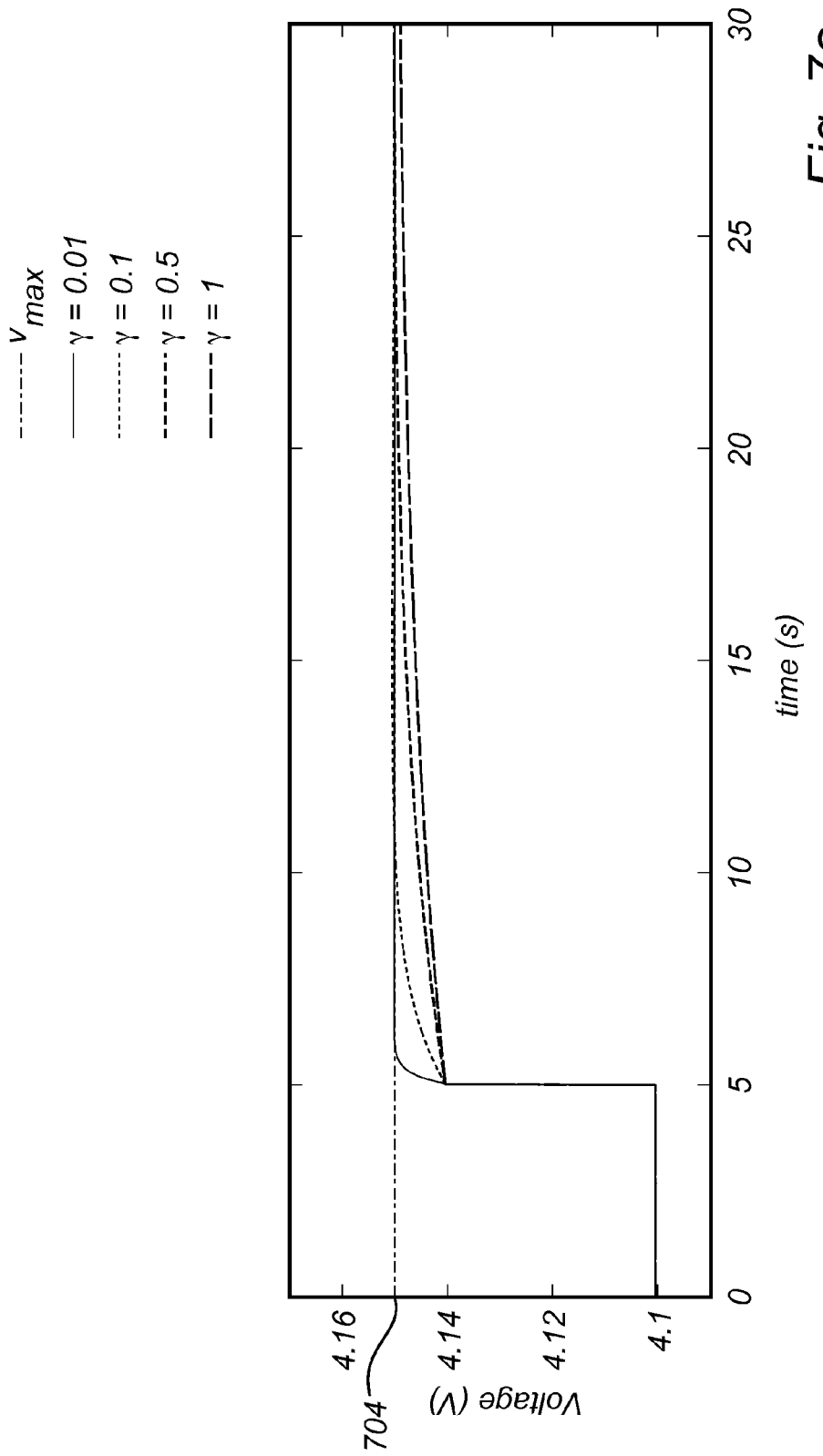

POWER AND CURRENT ESTIMATION FOR BATTERIES

CROSS-REFERENCE TO RELATED APPLICATIONS

This application claims foreign priority benefits under 35 U.S.C. § 119(a)-(d) to European patent application number EP 14192282.3, filed Nov. 7, 2014, which is incorporated by reference in its entirety.

TECHNICAL FIELD

The present disclosure relates to a method and a system for determining a charge current or a discharge current of an energy storage cell.

BACKGROUND

Electric and hybrid vehicles have recently become a more common sight on roads worldwide. They have one thing in common and that is they all require a large and powerful rechargeable energy storage, for example a rechargeable battery. Such rechargeable batteries have a limited runtime every time it is recharged and a user typically has a way of monitoring an estimated currently available energy of the battery (e.g. in the form of estimated range reachable with the presently available energy).

The available power, or "state of power" (SoP), is a characteristic to monitor during operation of the vehicle. A battery management system of the vehicle typically continuously monitors ("online") the currently available power. Furthermore, the battery management system may try to predict the future behavior of the battery during charging or discharging of the battery. Among the variables to monitor is the maximum charging and maximum discharging currents that can be applied without violating certain pre-known power limits of the battery.

A common approach for online monitoring of the state of power of a battery is to use an equivalent circuit model of the battery. The state of power is often estimated concurrently with the parameters of the equivalent circuit (e.g. resistances and capacitances), the state of charge (SoC), and the open circuit voltage (OCV), etc. The circuit parameters, SoC, and OCV depend on each other and SoP depends on the circuit parameters. However, since the time-scale of their dynamics, the reliability of a concurrent estimation may be questioned. Thus, the use of e.g. SoC or OCV for estimating the short term behavior of a battery relies on a relatively high degree on the accuracy of the estimates of SoC or OCV. For example, an error in the open circuit voltage because of poor modeling, or hysteresis or a bias in a current sensor may lead to errors in estimating the e.g. state of power of the battery.

An example of a method for determining battery predictive power limits is disclosed by U.S. Pat. No. 8,466,684. In U.S. Pat. No. 8,466,684, a maximum power limit may be predicted for a future time period based on the battery current and voltage in a time period preceding the future time period. However, the method disclosed by U.S. Pat. No. 8,466,684 suffers from poor adaptability to changes in demand of power, and in particular to rapid changes in demand of power from the battery.

Thus, there is a need for a more reliable and robust way of determining the state of power of a battery.

SUMMARY

In view of the above, it is a general object of the present disclosure to provide a more accurate method and system for estimating an available electrical power of an energy storage cell without violating voltage or power constraints of the energy storage cell.

According to a first embodiment it is therefore provided a method for determining a maximum charge current ($i_{max}$) or a maximum discharge current ($i_{min}$) of an energy storage cell, the method comprising the steps of:

(a) providing a predetermined upper voltage limit ($V_{max}$) or lower voltage limit ($V_{min}$) of the energy storage cell;

(b) providing a time horizon ($\Delta t$) as a time difference from a present time (t) to a future time (t+$\Delta t$);

wherein, with a repetition time period ($\Delta T$) different from the time horizon, repeating the following steps:

(c) measuring a present voltage level (V) of the energy storage cell;

(d) calculating a voltage difference ($\Delta V$) between the present voltage level and the upper voltage limit ($V_{max}$) or lower voltage limit ($V_{min}$);

(e) based on the voltage difference, the time horizon, and a model relating an electrical charge current or an electrical discharge current to the respective estimated voltage of the energy storage cell, determining the maximum electrical charge current ($i_{max}$) or maximum electrical discharge current ($i_{min}$) of the energy storage cell corresponding to the voltage difference, wherein the maximum electrical charge current or maximum electrical discharge current is such that the respective estimated voltage of the energy storage cell is less than or equal to the upper voltage limit during the time horizon in the case of an electrical charge current or, larger than or equal to the lower voltage limit during the time horizon in the case of an electrical discharge current.

In accordance with the disclosure, an upper voltage limit may be a voltage limit set in order not to overcharge the energy storage device, which may be harmful for the energy storage cells of the energy storage device. Similarly, the lower voltage limit may be set such that over discharge of the energy storage cell is prevented. The upper voltage limit and the lower voltage limit may change over the course of the lifetime of the energy storage cell. The voltage limits may for example change depending on the temperature of the energy storage cell.

Although the method according to the disclosure is performed on an energy storage cell, it should be noted that in a typical situation, the method is performed on an energy storage device comprising a plurality of energy storage cells, for example 2-200 such energy storage cells, or even 2-10 000 such energy storage cells. The method is then executed on more than one of the energy storage cells, most commonly on all of the energy storage cells of the energy storage device, and may use the smallest of the estimated maximum electrical charge current among the maximum electrical charge currents of the energy storage cells to limit the applied electrical charge current. Similarly, the method may use the smallest of the estimated maximum electrical discharge currents among the maximum electrical charge currents of the energy storage cells to limit the withdrawn electrical discharge current.

The model may be an equivalent circuit model comprising a capacitance and a resistance of the energy storage cell. Thus, the model may be, but is not limited to, an RC-circuit model.

The duration of the time horizon and the duration of the repetition time period may overlap. Thus, the time horizon and the repetition time period may lapse simultaneously. Furthermore, the term "repeating the following steps" should be interpreted as that the "following steps" are repeated at least twice, or until a user or a system terminates the method, for example by turning off the system running the method. Moreover, in each repetition, the time horizon moves with the repetition. Thus, the time horizon is a time value added to the present time in each repetition with the repetition time ΔT. For example, if the present time at a first repetition of the repeated steps of the method is t', then the end of the time horizon is t'+Δt where Δt is the time horizon. In the next repetition, the present time is t"=t'+ΔT, and therefore the end of the time horizon is t"+Δt=t'+ΔT+Δt and so on. That the repetition time period is different from the time horizon should not be interpreted as that the value of the repetition time period is different from the value of the time horizon, but rather that they are independent from each other. The repetition time period may for example be within the range of 0.2 seconds to 1 second, for example 0.05 seconds or 0.5 seconds.

The present disclosure is based on the realization that by predicting a change in voltage caused by a change in charge electrical current or a change in discharge electrical current an adaption to a current state of the energy storage cell may be accomplished automatically. With the disclosure, the maximum electrical charge current or the maximum electrical discharge current is recalculated every sample (with a repetition time period) for a time horizon such that the predicted voltage at the end of the time horizon is below a voltage limit. However, since the maximum electrical charge current or the maximum electrical discharge current is recalculated every sample, the actual voltage of the energy storage cell is efficiently kept below the voltage limit. Furthermore, the maximum electrical charge current or the maximum electrical discharge current may converge towards the limit if a demanded power is larger than an available power.

With the disclosure an available supply of current during a coming time (thus during the time horizon) may be predicted. Such as for example for a vehicle in order to determine e.g. if additional energy (or additional power) is needed from a backup energy storage device (e.g. battery or fuel) in order to manage overtaking another vehicle.

Note that the sign of a discharge current is negative and the sign of a charge current is positive in accordance with the direction of the current from or to the energy storage cell. Thus, a discharge current is negative since a discharge current leaves the energy storage cell. Thereby, when it comes to determining a "maximum" discharge current it means the discharge current with largest negative value. For example, a discharge current of −10 A is larger than a discharge current of −9 A.

The maximum electrical charge current or maximum electrical discharge current may be such that the estimated voltage at the end of the time horizon is equal to the upper voltage limit or the lower voltage limit respectively. Thus, from the model, the maximum electrical charge current or the maximum electrical discharge current are based on the assumption that the estimated voltage is equal to the respective voltage limit at the end of the time horizon. This means that, the voltage limit may be violated beyond the time horizon if a charge current or discharge current is applied/withdrawn with the magnitude of the respective maximum electrical charge current or maximum electrical discharge current. However, since the maximum electrical charge current or maximum electrical discharge current is recalculated every sample (with a repetition time period), an adaption to the current state is achieved which prevents such violation.

Furthermore, the repetition time period may be shorter than the time horizon. The maximum electrical charge current or the maximum electrical discharge current is then recalculated before the time horizon has lapsed. This improves the adaption capability of the method. The repetition time period and the time horizon may overlap.

In embodiments of the disclosure, for estimating the estimated voltage predicted from the model of the energy storage cell, the maximum electrical charge current or maximum electrical discharge current may be assumed to be applied to the energy storage cell for charging for the entire time horizon, or withdrawn from the energy storage cell for the entire time horizon. Thus, when estimating the voltage from the model of the energy storage cell, it is assumed (as an input to the model) that the maximum electrical charge current or maximum electrical discharge current is applied for the entire time horizon. Note that the maximum electrical charge current or maximum electrical discharge current is recalculated every sample with a repetition time preferably shorter than the time horizon.

Furthermore, the maximum electrical charging current or maximum electrical discharge current may be assumed to be constant in magnitude for the entire time horizon. Thus, for predicting the estimated voltage from the model, it may be assumed that the maximum electrical charge current or maximum electrical discharge current is constant over the duration of the time horizon. Note that the maximum electrical charge current or maximum electrical discharge current is recalculated every sample with a repetition time preferably shorter than the time horizon, thus it is not likely that the maximum electrical charge current or maximum electrical discharge current is actually constant through-out the entire time horizon but is merely used as an assumption for the model prediction in this embodiment.

According to an embodiment of the disclosure, the maximum electrical charge current or maximum electrical discharge current ($i_{max}$; $i_{min}$) may be given by:

$$i_{max,min} = \frac{\Delta v + R_0 i(t) + \hat{v}_1(t)\left(1 - e^{\frac{-\Delta t}{R_1 C_1}}\right)}{R_0 + R_1\left(1 - e^{\frac{-\Delta t}{R_1 C_1}}\right)},$$

where $R_1$, $C_1$, are the resistance, capacitance of a first RC equivalent circuit and $\hat{v}_1$ is the estimated voltage across the first RC equivalent circuit, wherein Δv for the maximum electrical charge current ($i_{max}$) is the difference between the upper voltage limit and the measured voltage, and Δv for the maximum electrical discharge current ($i_{min}$) is the difference between the lower voltage limit and the measured voltage.

In yet another embodiment of the disclosure, the maximum electrical charge current or maximum electrical discharge current ($i_{max}$; $i_{min}$) may be given by:

$$i_{max,min} = \frac{\Delta v + R_0 i(t) + \hat{v}_1(t)\left(1 - e^{\frac{-\Delta t}{R_1 C_1}}\right) + \hat{v}_2(t)\left(1 - e^{\frac{-\Delta t}{R_2 C_2}}\right)}{R_0 + R_1\left(1 - e^{\frac{-\Delta t}{R_1 C_1}}\right) + R_2\left(1 - e^{\frac{-\Delta t}{R_2 C_2}}\right)}$$

where $R_1$, $C_1$, are the resistance, capacitance of the first RC equivalent circuit and $\hat{v}_1$ is the estimated voltage across the first RC equivalent circuit, and $R_2$, $C_2$, are the resistance, capacitance, and voltage of a second RC equivalent circuit and $\hat{v}_2$ is the estimated voltage across the second RC equivalent circuit of a two RC-circuit model of the energy storage cell, and wherein $\Delta v$ for the maximum electrical charge current ($i_{max}$) is the difference between the upper voltage limit and the measured voltage, and $\Delta v$ for the maximum electrical discharge current ($i_{min}$) is the difference between the lower voltage limit and the measured voltage.

Furthermore, the disclosure is equally applicable to higher order RC-circuits, for example third, fourth, fifth order circuits etc. It would be straight forward for a person skilled in the art to apply the disclosure to higher order RC-circuits. In a two-circuit model, or a higher order model, the RC circuits may be considered to be cascaded or be configured in parallel.

According to an embodiment of the disclosure, the maximum electrical charge current or maximum electrical discharge current may be further based on a further model comprising a convergence factor, wherein a magnitude of the maximum electrical charge current or maximum electrical discharge current depends on the magnitude of the convergence factor. With the convergence factor, the estimated voltage reaches the voltage limit (upper limit or lower limit) at a different rate than without the convergence factor.

Furthermore, the energy storage cell and a controller may be modeled as a feedback control system, wherein the energy storage cell is modeled as a transfer function (G) from change in charge current or change in discharge current to a change in voltage given by:

$$G(s) = R_0 + \frac{R_1}{1 + \tau s},$$

and the controller is a feedback controller comprising an integral action, with a second transfer function from the voltage difference to the maximum electrical charge current or the maximum electrical discharge current. An integral action implies that the feedback is based on an integral of the input, for example the voltage difference. The feedback control may be particularly used when a demanded charge electrical current or discharge electrical current is higher than the respective maximum electrical charge current or maximum electrical discharge current.

In some embodiments, the controller may be a PI-controller with the second transfer function (F) given by:

$$F(s) = \frac{1}{R_1\left(1 - e^{-\frac{\Delta t}{R_1 C_1}}\right)}\left(1 + \frac{1}{R_1 C_1 s}\right),$$

where $R_1$ is an electrical resistance and $C_1$ is a capacitance in a RC-circuit model of the energy storage cell, $R_0$ is the internal electrical resistance of the energy storage cell, and $\tau = R_1 C_1$, wherein the maximum electrical charge current or maximum electrical discharge current is further based on an output of the second transfer function. A PI-controller is a feedback controller with an integral action and a proportional action. In other words, the output is based on a first part which is proportional ("P") to the input signal (present voltage difference) and a second part which depends on the integral ("I") of the previous signal (e.g. previous voltage differences). This feedback control may also be particularly used when a demanded charge electrical current or discharge electrical current is higher than the respective maximum electrical charge current or maximum electrical discharge current.

Moreover, convergence factor ($\gamma$) may be larger than zero, and wherein, with the convergence factor, the controller F(s) is given by:

$$F(s) = \frac{1}{R_1\left(1 - e^{\frac{\Delta t}{R_1 C_1}}\right)}\left(1 + \frac{1}{\gamma R_1 C_1 s}\right).$$

The convergence factor may also be smaller than or equal to 1, although this is not a requirement.

According to a second embodiment of the disclosure, there is provided a method for controlling an electrical charge current or electrical discharge current of an energy storage cell, the method comprises the steps according to the first embodiment, wherein the method further comprises the steps of:

receiving a request for a demanded electrical charge current or a demanded electrical discharge current from the energy storage cell;

wherein, if the demanded electrical charge current is larger than the maximum electrical charge current, controlling the energy storage cell to provide the maximum electrical charge current, or, wherein, if the demanded electrical discharge current is larger than the maximum electrical discharge current, control the energy storage cell to provide the maximum electrical discharge current.

Thus, the method according to the first embodiment may be implemented to actively limit the electrical charge current of electrical discharge current applied to/provided by the energy storage cell or an energy storage device comprising several such energy storage cells.

Furthermore, the PI-controller transfer function describes a control of the energy storage cell in particular in the case of when the demanded current is larger than the maximum electrical charge current or the maximum electrical discharge current. In that case, the energy storage cells and the method reflect a PI control feedback system.

The provided current may also be limited by limits other than the maximum electrical charge current or maximum electrical discharge current. For example, the provided current may be limited by a maximum current limit of the energy storage cell itself, or by the state of charge of the energy storage device comprising the energy storage cell.

Further effects and features of this second embodiment of the present disclosure are largely analogous to those described above in connection with the first embodiment of the disclosure.

According to a third embodiment of the disclosure, there is provided a system for determining a maximum charge current ($i_{max}$) or a maximum discharge current ($i_{min}$) of an energy storage cell, the system comprising:

a control unit;

a voltage measuring device; and a current measuring device, wherein the control unit is configured to:

(a) receive a predetermined upper voltage limit ($V_{max}$) or lower voltage limit ($V_{min}$) of the energy storage cell;

wherein, with a repetition time period ($\Delta T$) different from a predetermined time horizon ($\Delta t$) being a time difference from a present time to a future time, the control unit is configured to repeat the following steps:

(c) receive, from the voltage measuring device, a measurement of a present voltage level (V) of the energy storage cell;

(d) calculate a voltage difference ($\Delta V$) between the present voltage level and the upper voltage limit ($V_{max}$) or the lower voltage limit ($V_{min}$);

(e) based on the voltage difference, the time horizon, and a model relating an electrical charge current or an electrical discharge current to the respective estimated voltage of the energy storage cell, determine the maximum electrical charge current ($i_{max}$) or maximum electrical discharge current ($i_{min}$) of the energy storage cell corresponding to the voltage difference, wherein the maximum electrical charge current or maximum electrical discharge current is such that the respective estimated voltage of the energy storage cell is less than or equal to the upper voltage limit during the time horizon in the case of an electrical charge current or, larger than or equal to the lower voltage limit during the time horizon in the case of an electrical discharge current.

According to an embodiment of the disclosure, the control unit may be further configured to:

receive a request for a demanded electrical charge current or a demanded electrical discharge current from the energy storage cell;

wherein, if the demanded electrical charge current is larger than the maximum electrical charge current, control the energy storage cell to provide the maximum electrical charge current, or, wherein, if the demanded electrical discharge current is larger than the maximum electrical discharge current, control the energy storage cell to provide the maximum electrical discharge current.

Thus, if the demanded electrical charge current is larger than the previously determined maximum electrical charge current, only the maximum electrical charge current will be delivered to the energy storage cell (i.e. the energy storage device comprising the energy storage cell). Or, if the demanded electrical discharge current is larger than the previously determined maximum electrical discharge current, only the maximum electrical discharge current will be withdrawn from the energy storage cell (i.e. the energy storage device comprising the energy storage cell). Furthermore, it should be understood that it is the control unit that ensures that the current limits (maximum electrical charge current or maximum electrical discharge current) are not violated and not the energy storage cell (or energy storage device) itself.

The control unit may for example receive the request from the engine of an electrical vehicle. The control unit may be a control unit of a battery management system handling the distribution of electric power from the energy storage device to the various loads of e.g. a vehicle comprising the energy storage device.

According to yet another embodiment of the disclosure, the control unit may partially be configured as a feedback controller with integral action such that if the demanded current is larger than the maximum current, the applied current can be determined as the output of a feedback controller, with integral action and appropriate anti-windup and initialization, having the voltage difference as reference input.

Furthermore, the controller may be a PI-controller with a second transfer function (F) given by:

$$F(s) = \frac{1}{R_1\left(1 - e^{-\frac{\Delta t}{R_1 C_1}}\right)}\left(1 + \frac{1}{\gamma R_1 C_1 s}\right),$$

where $R_1$ is an electrical resistance and $C_1$ is a capacitance in a RC-circuit model of the energy storage battery, and $\gamma$ is a parameter between 0 and 1, wherein the maximum electrical charge current or the maximum electrical discharge current is further based on the output provided by the transfer function.

The energy storage cell may be part of the system. Alternatively, an energy storage device comprising 2-200 such energy storage cells, or even 2-10 000 such energy storage cells may be part of the system.

The control unit may comprise one or more processors or any other type of computing device, such as a microprocessor, microcontroller, programmable digital signal processor (DSP) or any other programmable device. The control unit may also, or instead, include an application specific integrated circuit (ASIC), a programmable gate array or programmable array logic, a programmable logic device, or a digital signal processor (DSP). Where the control unit includes a programmable device such as a processor, microprocessor, microcontroller or programmable digital signal processor, the control unit may further include a memory or storage for storing computer executable code for controlling operation of the programmable device and/or for performing any of the operations or functions described herein. The control unit may comprise a computer readable medium which may be any type of memory device, including one of a removable nonvolatile/volatile random access memory, a hard disk drive, a floppy disk, a CD-ROM, a DVD-ROM, a USB memory, an SD memory card, or a similar computer readable medium known in the art.

The system may advantageously be arranged in a vehicle. For example, the system may advantageously be used for monitoring an energy storage device, such as a rechargeable battery, of an electric or hybrid vehicle. The system may thus advantageously be arranged in the vehicle. However, the control unit of the system may be arranged elsewhere, outside the vehicle.

Further effects and features of this third embodiment of the present disclosure are largely analogous to those described above in connection with the first embodiment and the second embodiment of the disclosure.

Further features of, and advantages with, the present disclosure will become apparent when studying the appended claims and the following description. The skilled person realizes that different features of the present disclosure may be combined to create embodiments other than those described in the following, without departing from the scope of the present disclosure.

BRIEF DESCRIPTION OF THE DRAWINGS

The present disclosure will now be described in more detail, with reference to the appended drawings showing embodiments of the disclosure, wherein:

FIG. 4a-b show simulated voltage (FIG. 4a) and current (FIG. 4b) through an energy storage cell;

FIG. 7a-b show simulated voltage (FIG. 7a) and current (FIG. 7b) through an energy storage cell;

DETAILED DESCRIPTION

As required, detailed embodiments are disclosed herein. However, it is to be understood that the disclosed embodiments are merely exemplary and that various and alternative forms may be employed. The figures are not necessarily to scale. Some features may be exaggerated or minimized to show details of particular components. Therefore, specific structural and functional details disclosed herein are not to be interpreted as limiting, but merely as a representative basis for teaching one skilled in the art.

In the following description, the present disclosure is mainly described with reference to an energy storage device of an electrical or hybrid vehicle. It should, however, be noted that this by no means limits the scope of the disclosure, which is equally applicable to other types of energy storage devices arranged in devices or arrangements other than vehicles.

Figure 1:
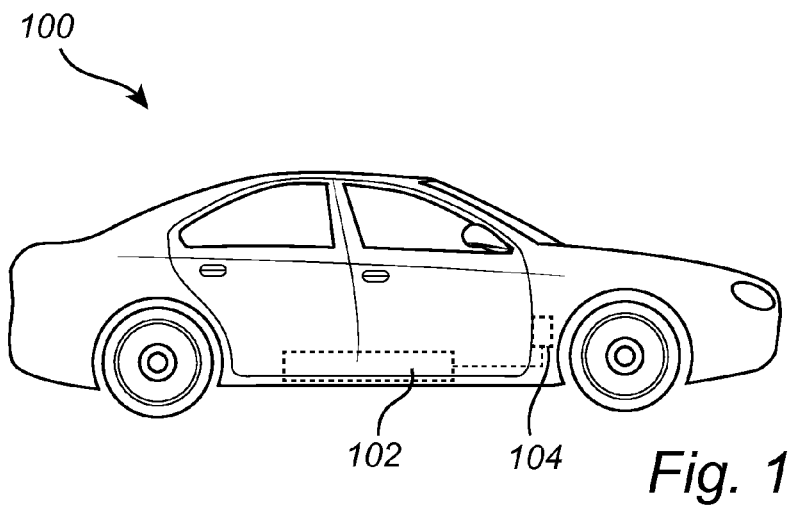
FIG. 1 illustrates an exemplary application for an embodiment of the disclosure.

FIG. 1 illustrates an exemplary application for a system according to an embodiment of the disclosure. In FIG. 1 there is shown a vehicle 100 in the form of a hybrid or electric car 100 comprising a rechargable battery 102. In the vehicle 100 there is further a battery management system 104 for controlling the rechargable battery 102 and monitoring the operation and status of the battery 102.

Figure 2:
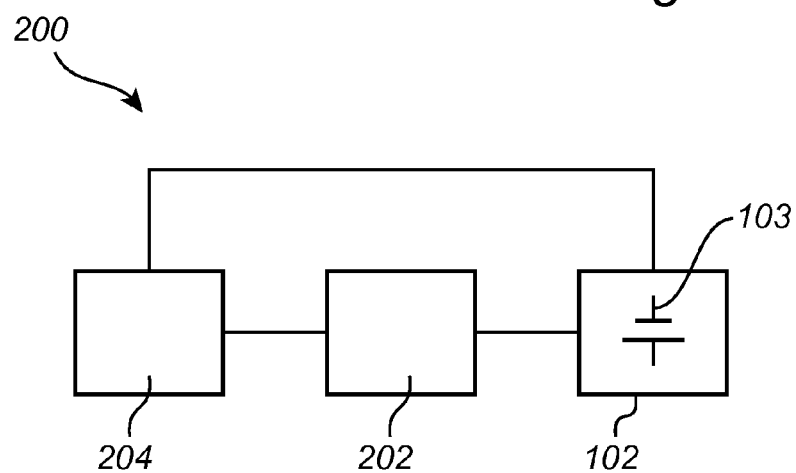
FIG. 2 schematically shows a system according to an exemplary embodiment of the disclosure.

FIG. 2 schematically illustrates an exemplary system according to an embodiment of the disclosure. In FIG. 2, the system 200 comprises at least one sensor 202 and a control unit 204 in the form of a microprocessor 204 connected to the sensor 202 such that the microprocessor 204 may receive signals from the sensor 202. The control unit may be part of the battery managements system 104, but may also be a control unit external to the battery management system 104. The sensor 202 may for example be a sensor for detecting the voltage of or the current through the battery 102. Furthermore, the control unit 204 may also be directly connected to the battery 102 for controlling e.g. the outgoing supply (thus a discharge current) of current or a charge current of the battery 102, or the control unit 204 may receive information regarding the state of the battery 102 directly from the battery. Thus, the control unit 204 may be configured to monitor the state of the battery 102. In particular, the control unit 204 is configured to control and monitor a discharge current and a charge current of the battery via for example relays and converters. The control unit 204 may further monitor and control the discharge current and a charge current of individual battery cells 103 of the battery 102. The control unit then uses the lowest maximum electrical discharge current and the lowest maximum electrical charge current determined form the cells (e.g. cell 103) of the battery as the maximum electrical discharge current and the maximum electrical charge current of the entire battery. The steps for determining the maximum electrical discharge current and the maximum electrical charge current will be described with reference to proceeding drawings of the application. The system may further comprise the necessary electrical components for monitoring the present power level, (i.e. the capacity Q) of the battery 102.

Figure 3:
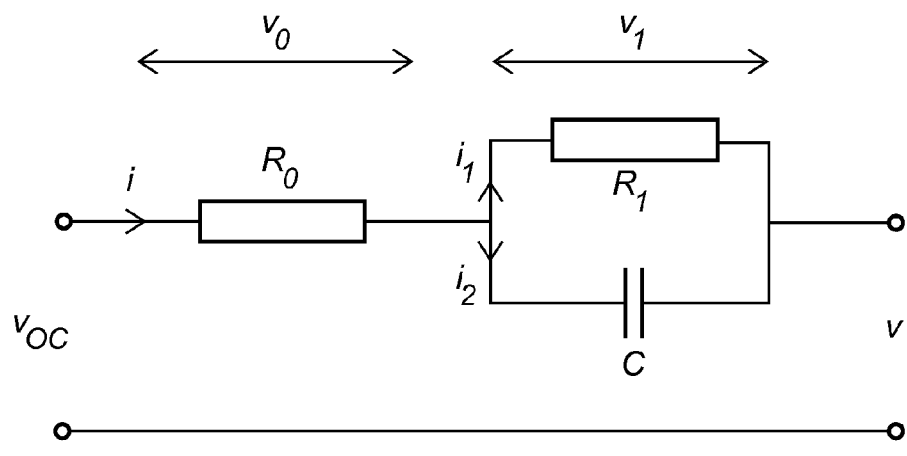
FIG. 3 shows an equivalent circuit of an energy storage cell.

FIG. 3 shows an equivalent circuit of an energy storage cell (e.g. energy storage cell 103) in the form of a resistance ($R_0$) in series with an RC-circuit (resistance $R_1$ and capacitance $C_1$) with corresponding voltage $V_1$ over the RC-circuit and the voltage $V_0$ across the internal resistance $R_0$, and $V_{oc}$ is the open circuit voltage. Applying Kirchoff's laws on this circuit gives an ordinary differential equation:

$$\frac{d}{dt}v_1(t) = -\frac{1}{R_1 C_1} v_1(t) + \frac{1}{C_1} i(t) \quad (1)$$

with solution:

$$v_1(t) = e^{\frac{t_0-t}{R_1 C_1}} v_1(t_0) + \frac{1}{C_1} \int_{t_0}^{t} e^{\frac{\tau-t}{R_1 C_1}} i(\tau) d\tau$$

Thus, if a constant current i is applied on the time interval $(t_0, t]$ the analytical expression for the estimated future voltage at time t becomes:

$$v_1(t) = v_1(t_0) e^{-\frac{t-t_0}{R_1 C_1}} + R_1 i \left(1 - e^{-\frac{t-t_0}{R_1 C_1}}\right)$$

If we now let the current time t be $t_0$ and we want to predict the voltage at the end of a time horizon, thus at the time $t+\Delta t$ being the end of the time horizon ($\Delta t$), we get:

$$v_1(t+\Delta t) = v_1(t_0) e^{-\frac{\Delta t}{R_1 C_1}} + R_1 i(t^+) \left(1 - e^{-\frac{\Delta t}{R_1 C_1}}\right)$$

if $i(t^+)$ is a constant current applied on the time interval $(t, t+\Delta t]$. Assuming that the open circuit voltage is unchanged on this time interval, the total voltage output is then:

$$v(t) = v_{oc} + R_0 i(t) + v_1(t)$$

$$v(t+\Delta t) = v_{oc} + R_0 i(t^+) + (t+\Delta t).$$

Now, in order to determine what constant charge current ($i_{max}$) will give the maximum allowable charge voltage (thus the upper limit, $V_{max}$) at time $t+\Delta t$, we calculate the voltage difference $\Delta v$, $$\Delta v = v_{max} - v(t) = R_0(i_{max} - i(t)) + v_1(t)\left(e^{\frac{-\Delta t}{R_1 C_1}} - 1\right) + R_1 i_{max}\left(1 - e^{\frac{-\Delta t}{R_1 C_1}}\right) =$$
$$\left(R_0 + R_1 - R_1 e^{\frac{-\Delta t}{R_1 C_1}}\right) i_{max} - R_0 i(t) + v_1(t)\left(e^{\frac{-\Delta t}{R_1 C_1}} - 1\right).$$

From this equation, we may now calculate, at each time instant with the repetition time period ($\Delta T$), the maximum charge current $i_{max}$ of duration $\Delta t$:

$$i_{max,min} = \frac{\Delta v + R_0 i(t) + \hat{v}_1(t)\left(1 - e^{\frac{-\Delta t}{R_1 C_1}}\right)}{R_0 + R_1\left(1 - e^{\frac{-\Delta t}{R_1 C_1}}\right)} \quad (2)$$

where, for the maximum electrical charge current ($i_{max}$) the voltage difference $\Delta v$ is the difference between the upper voltage limit ($V_{min}$) and the measured voltage (v(t)), and for the maximum electrical discharge current ($i_{min}$) the voltage difference $\Delta v$ is between a lower voltage limit ($V_{min}$) and the measured voltage (v(t)). The voltage $\hat{v}_1$ is an estimate of $V_1$ indicated in the model shown in FIG. 3, thus $\hat{v}_1$ is not available as a measurement.

A maximum electrical charge current and maximum electrical discharge current may similarly be determined for more complex equivalent circuit models. For example, some battery cells are more accurately described by two or more cascaded RC-circuits. In the case of two RC-circuits, thus an internal resistance $R_0$ followed by a first and a second RC-circuit comprising $R_1$, $C_1$, and $R_2$, $C_2$ respectively, the maximum electrical charge current and maximum electrical discharge current will be given by (and is derived in the same way as equation (2)):

$$i_{max,min} = \frac{\Delta v + R_0 i(t) + \hat{v}_1(t)\left(1 - e^{\frac{-\Delta t}{R_1 C_1}}\right) + \hat{v}_2(t)\left(1 - e^{\frac{-\Delta t}{R_2 C_2}}\right)}{R_0 + R_1\left(1 - e^{\frac{-\Delta t}{R_1 C_1}}\right) + R_2\left(1 - e^{\frac{-\Delta t}{R_2 C_2}}\right)}.$$

FIG. 4a-b is a plot of simulated voltage (FIG. 4a) and current (FIG. 4b) through an energy storage cell. A change in current charge demand is increased at time=5 seconds from 40 amperes to 100 amperes. At time before 5 seconds, the present current (i) is not limited by the maximum electrical charge current (thus 40 amperes is provided), however, after time=5 seconds the current is limited by the maximum electrical charge current in order not to violate the voltage constraints (thus 100 amperes is not provided). The illustration in FIG. 4a-b shows simulations for different time horizons ($\Delta t$=0 s, 2 s, 5 s), and the dashed line 401 shows an hypothetical case that if the current is actually kept constant for the entire time horizon (in this case $\Delta t$=5 s) as shown by the constant current 405 in FIG. 4b the voltage limit 402 is violated at the end 404 of the time horizon, at 10 seconds. However, since the maximum electrical charge current ($i_{max}$) is estimated with a repetition time period ($\Delta T$) shorter than the time horizon ($\Delta t$), the current (in FIG. 4b) is kept below, or at $i_{max}$ such that the voltage does not violate the voltage limit 402 in the simulated cases 406, 407, 408. Furthermore, as shown in FIG. 4a-b, a longer time horizon ($\Delta t$) (e.g. current indicated by 406) implies that the maximum electrical charge current ($i_{max}$) is lower compared to with a shorter time horizon ($\Delta t$) (e.g. current indicated by 408). Typical values for the capacitance (C) and resistance ($R_0$ and $R_1$) in the equivalent circuit model is $R_0$=1.2 m$\Omega$, $R_1$=1.2 m$\Omega$, and C=15 kF.

Figure 5A:
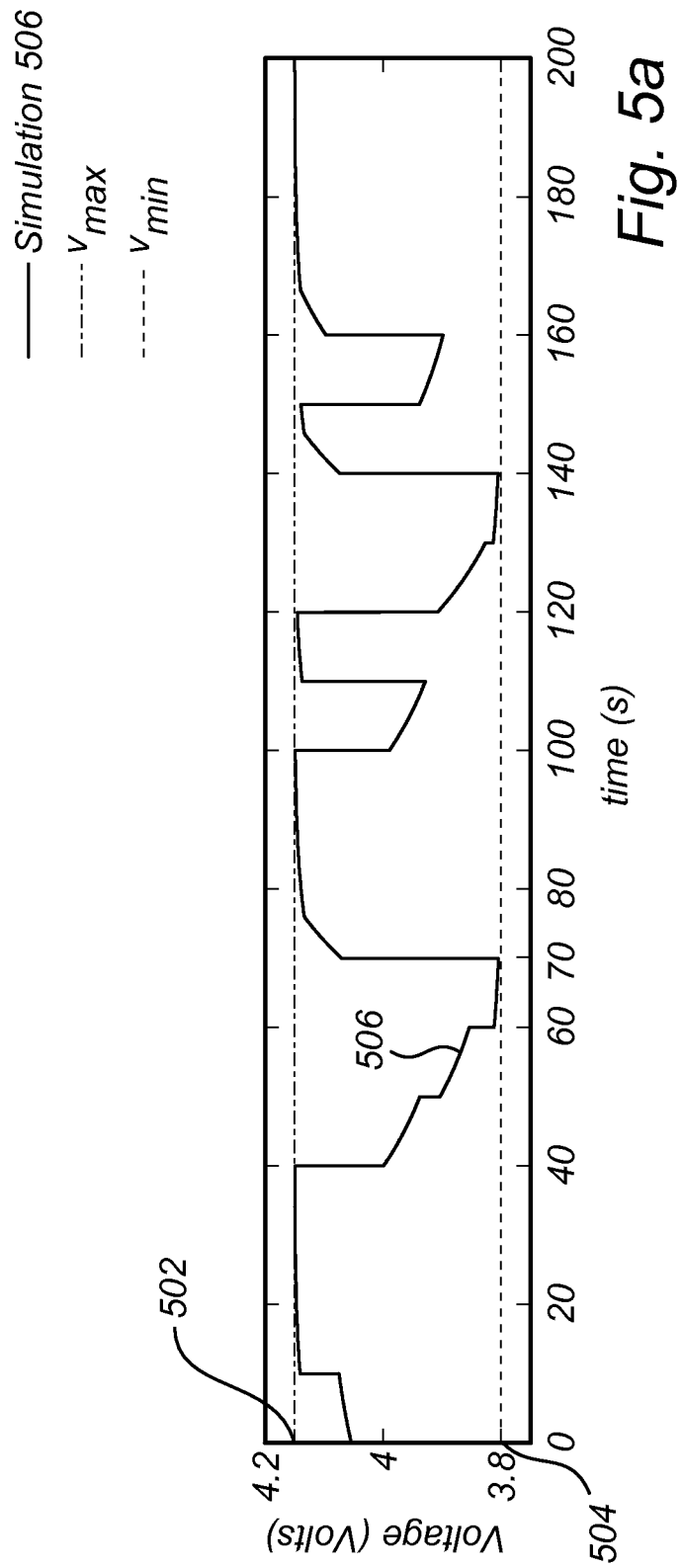
FIG. 5a-b show simulated voltage (FIG. 5a) and current (FIG. 5b) through an energy storage cell.
Figure 5B:
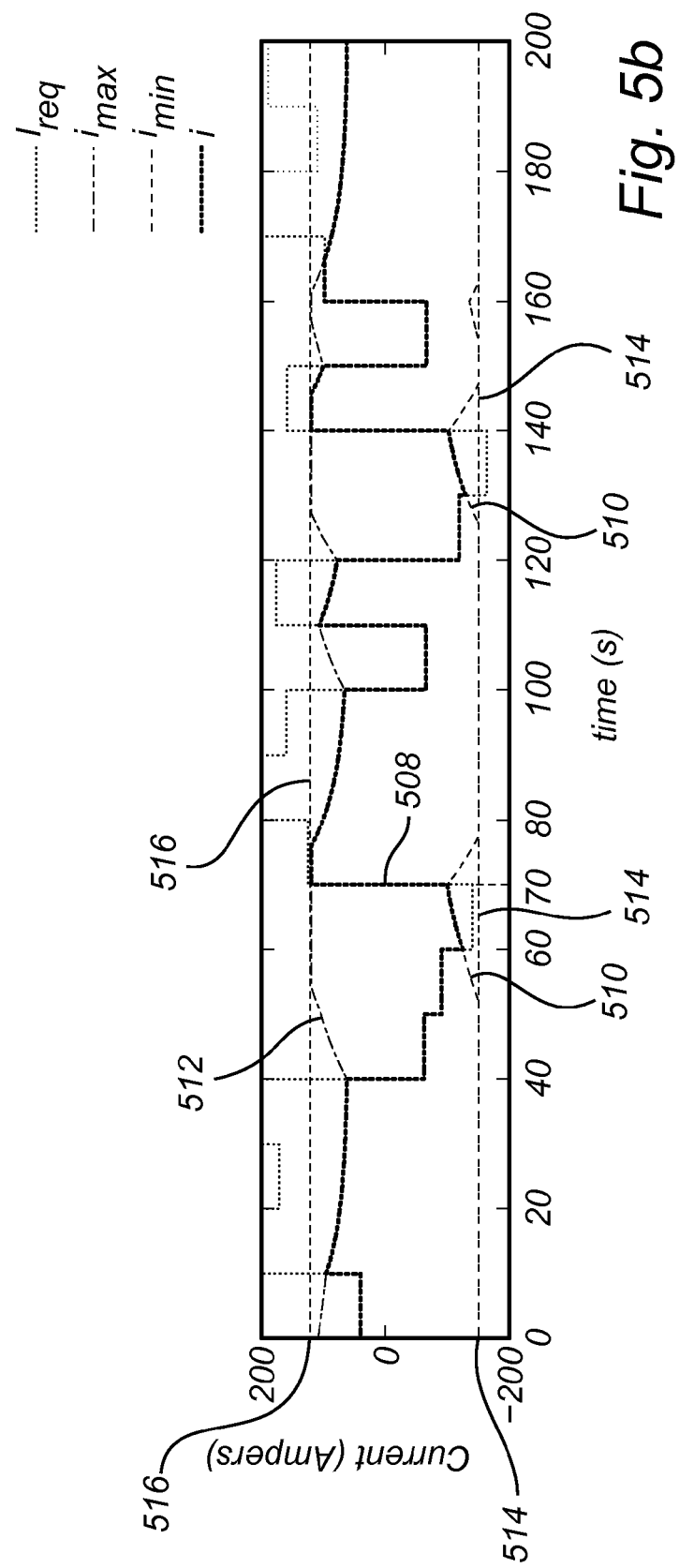

FIG. 5a-b show the results of a simulation of the voltage (FIG. 5a) and the current (FIG. 5b) through an energy storage cell. In FIG. 5a there is shown a plot of the simulated voltage 506 as a function of time, an upper voltage limit 502, and a lower voltage limit 504. FIG. 5b illustrates the corresponding current 508 through the energy storage cell, the maximum electrical discharge current 510 and the maximum electrical charge current 512, a demanded current ($I_{req}$) and a limit discharge current 514 ($I_{lim,d}$) and a limit charge current 516 ($I_{lim,c}$). Thus, note that the actual current (i) through the energy storage cell may be limited by more constraints than the maximum electrical charge current or the maximum electrical discharge current. In fact, the current from the energy storage cell may be given by:

i(t)=min($I_{req}$,$i_{max}$,$I_{lim,c}$,$I_{SOC}$, . . . ) where $I_{lim,c}$ is a charge current limit preset depending on current limitations of the energy storage device itself, for example the maximum capacity of the energy storage device, and $I_{SOC}$ is a current limit set by the present state of charge of the energy storage cell or energy storage device. Corresponding current limits exist for the discharge case (e.g. $I_{lim,d}$ 514 in FIG. 5b). In FIG. 5b $I_{lim,c}$=120 A, and it can be seen that when the demanded current exceeds $I_{lim,c}$ (for example at time=70 seconds in FIG. 5b), the current (i) is not allowed to exceed $I_{lim,c}$: the corresponding voltage in FIG. 5a (i.e. from time=70 seconds) approaches the voltage limit $V_{max}$ 502. However, at approximately 73 seconds, the demanded current $I_{req}$ is below $I_{max}$, then the provided current (i) is instead actively limited by the maximum electrical charge current 512 $I_{max}$ until time=100 seconds (where the demanded current is again changed).

Furthermore, as a discharge current is demanded, as shown in FIG. 5b at time=40 seconds by the current 508 (i) through the energy storage cell decreasing, the voltage 506 (FIG. 5a) decreases during the lapse from time=40 seconds to time=60 seconds, at which time (60 seconds) the current 508 is limited by the maximum electrical discharge current 510 (note that the discharge current is negative, thus the term "maximum" refers in this case to the "most" negative current) for about 10 seconds until time=70 seconds.

Figure 6:
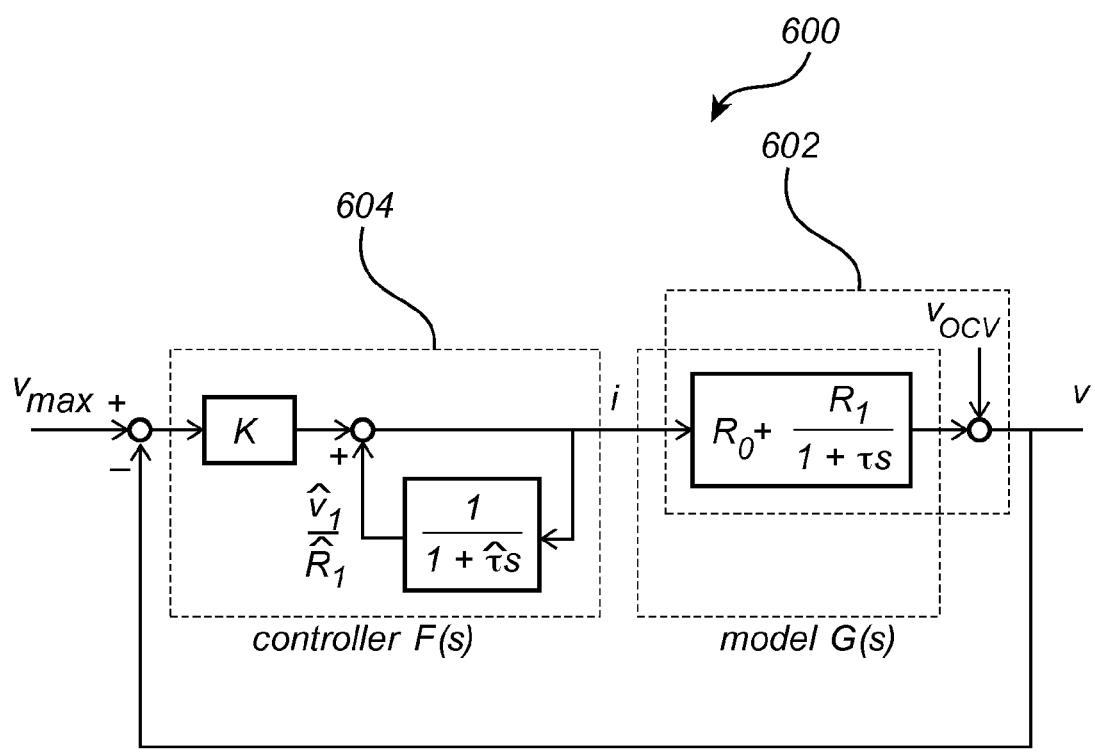
FIG. 6 illustrates the energy storage cell and control system represented as a feedback control system according to an exemplary embodiment.

FIG. 6 illustrates an energy storage cell 602 and a control system 604 represented as a feedback control system 600 in the situation where the maximum charge current is applied. In this situation, the demanded electrical charge current $I_{req}$ is larger than $i_{max}$ and thereby the current through the energy storage device is i=$i_{max}$. From equation (2), we find that $$i(t) = \frac{1}{R_1(1 - e^{-\Delta t/R_1 C_1})}(v_{max} - v(t)) + \frac{1}{R_1}\hat{v}_1(t).$$

Furthermore, from the differential equation (1), we may derive the transfer function (from current (i) to voltage $v_1$) for the energy storage cell 602 to be given by:

$$v_1(t) = \frac{R_1}{1 + \tau p} i(t), \tag{3}$$

where p=d/dt is the deriviative operator and $\tau$=$R_1 C_1$. In other words:

$$i(t) = K(v_{max} - v(t)) + \frac{1}{1 + \tau p} i(t) \text{ where } K = \frac{1}{R_1(1 - e^{-\Delta t/\tau})}.$$

The controller which has $v_{max}$-v(t) as input can therefore be expressed as:

$$i(t) = \frac{K(1 + \tau p)}{\tau p}(v_{max} - v(t)),$$

which may be represented by a PI-controller 604 (Proportional action and integration action controller) with transfer function:

$$F(s) = \frac{1}{R_1\left(1 - e^{-\frac{\Delta t}{R_1 C_1}}\right)}\left(1 + \frac{1}{R_1 C_1 s}\right).$$

From equation (3), the transfer function from current i to voltage $v_1+v_0$ (see FIG. 3) for the energy storage cell 602 is:

$$G(s) = R_0 + \frac{R_1}{1 + \tau s}.$$

In the previously described embodiments (e.g. as described in relation to FIG. 2-6), the time horizon Δt may be considered a tuning parameter for changing the immediate maximum charge current (610-612 in FIG. 4b) or immediate maximum discharge current, a model relating the current of the energy storage cell to a voltage may also comprise a convergence factor. The convergence factor (γ) may tune the time constant in an estimate of $v_1$ as based on equation (3) and thereby the rate of convergence of the estimated voltage ($\hat{v}_1$), thereby the initial available current, thus the immediate maximum discharge current or immediate maximum charge current may be tuned. For example, as can be seen in FIG. 4a-b, the longer the time horizon the more precautious the immediate change in charge or discharge current is when the demanded current excedds the maximum electrical charge current of maximum electrical discharge current. The convergence factor (γ) is related to the controller (F(s)) shown in FIG. 6 and may be implemented in the controller in the following way:

$$F(s) = \frac{1}{R_1\left(1 - e^{\frac{\Delta t}{R_1 C_1}}\right)}\left(1 + \frac{1}{\gamma R_1 C_1 s}\right)$$

in other words, the tuning factor is introduced by letting $\hat{\tau}=\gamma R_1 C_1$, where $\hat{\tau}=\gamma \tau$ (thus, the denominator of the last term of F(s), thereby not the static gain of the controller). G(s) may be described as a dynamic model.

Figure 7B:
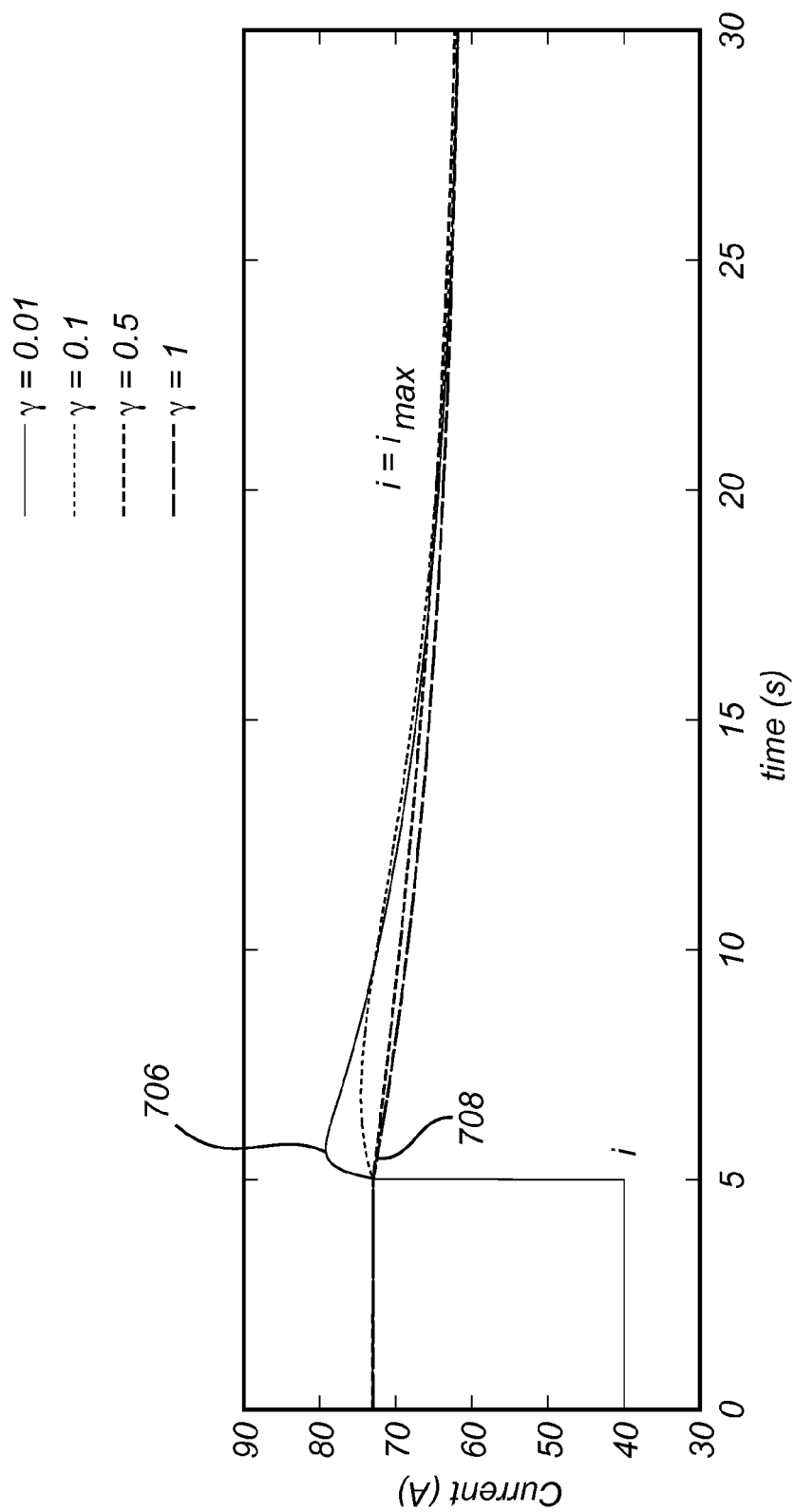

FIG. 7a-b show that as a result of the method according to an embodiment (comprising the convergence factor (γ)) of the disclosure, the voltage of the modeled energy storage cell converges towards the voltage limit 704 as a response to the increased charge current (i) at time=5 seconds. Furthermore, FIG. 7a-b shows a simulated voltage (FIG. 7a) and current (FIG. 7b) for different values of γ between 0 and 1. As shown in FIG. 7a the voltage is kept below the voltage limit 704 ($V_{max}$), although the convergence rate towards the voltage limit 704 depends on the magnitude of the convergence factor (γ). As shown in FIG. 7b, the electrical current increase at 5 seconds, where the demanded current increases from 40 A to 100 A, and is constrained by the maximum electrical charge current (time horizon Δt=5 s). However, the magnitude of the current (I) is allowed to be higher, at least initially after the change in demanded current, due to a higher maximum electrical charge current which is tuned by the convergence factor γ. For example with a convergence factor γ=0.01 a higher initial current 706 is allowed (thus the maximum electrical charge current is higher) compared to the initial current 708 when the convergence factor is equal to one (γ=1). With the convergence factor, a larger initial maximum electrical charge current or larger maximum electrical discharge current is allowed which results in a faster convergence of the voltage towards the voltage limit 704.

Figure 8:
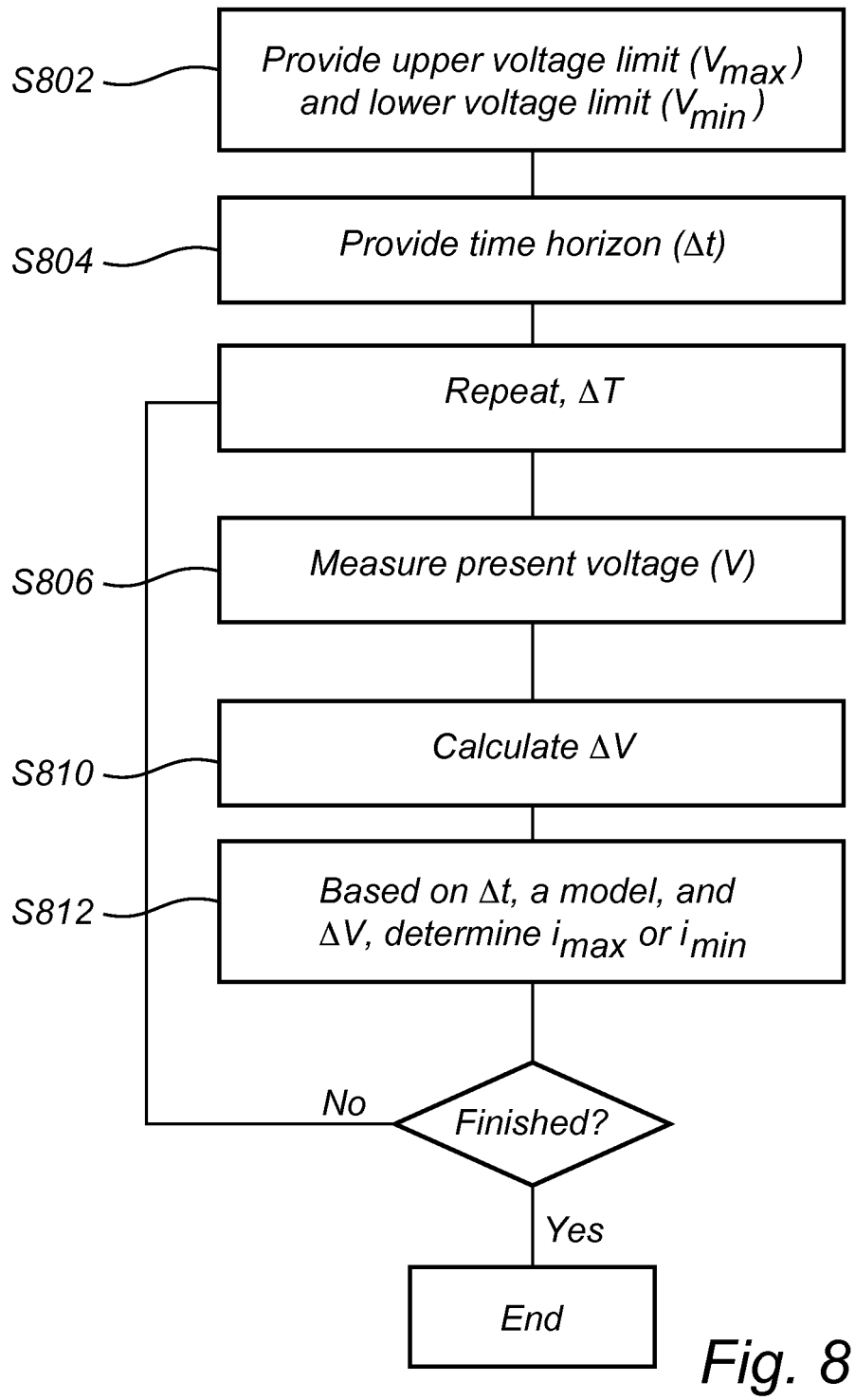
FIG. 8 is a flow-chart with method steps according to an exemplary embodiment of the disclosure.

FIG. 8 is a flow-chart of the steps of an exemplary method according to an embodiment of the disclosure. In a first step S802, providing a predetermined upper voltage limit ($V_{max}$) or lower voltage limit ($V_{min}$) of the energy storage cell. These voltage limits may be voltage limits introduced by the energy storage cell itself. In a subsequent step S804, providing a time horizon (Δt) as a time difference from a present time (t) to a future time ($t_1=t+\Delta t$). Next, in step S806 a present voltage level (V) of the energy storage cell is measured. Subsequently S810, calculate a voltage difference (ΔV) between the present voltage level and the upper voltage limit ($V_{max}$) or lower voltage limit ($V_{min}$). Based on the voltage difference, the time horizon, and a model relating an electrical charge current or an electrical discharge current to the respective estimated voltage of the energy storage cell, determine S812 the maximum change ($i_{max}$) in electrical charge current or maximum change ($i_{min}$) in electrical discharge current of the energy storage cell corresponding to the voltage difference. The maximum electrical charge current or maximum electrical discharge current is such that the estimated voltage of the energy storage cell is less than or equal to the upper voltage limit during the time horizon in the case of an electrical charge current or, larger than or equal to the lower voltage limit during the time horizon in the case of an electrical discharge current. Steps S806-S814 are repeated with the repetition time period ΔT which is different from the time horizon. The method may be finished by e.g. a user or a control unit. The method according to the embodiment of FIG. 8 may for example be repeated twice with the repetition time period.

The method described in FIG. 8 may further comprise steps of measuring the temperature of the energy storage cell or the energy storage device. The temperature measurement may be used for determining relevant energy storage cell parameters such as $R_0$, $R_1$, $C_1$, etc.

Figure 9:
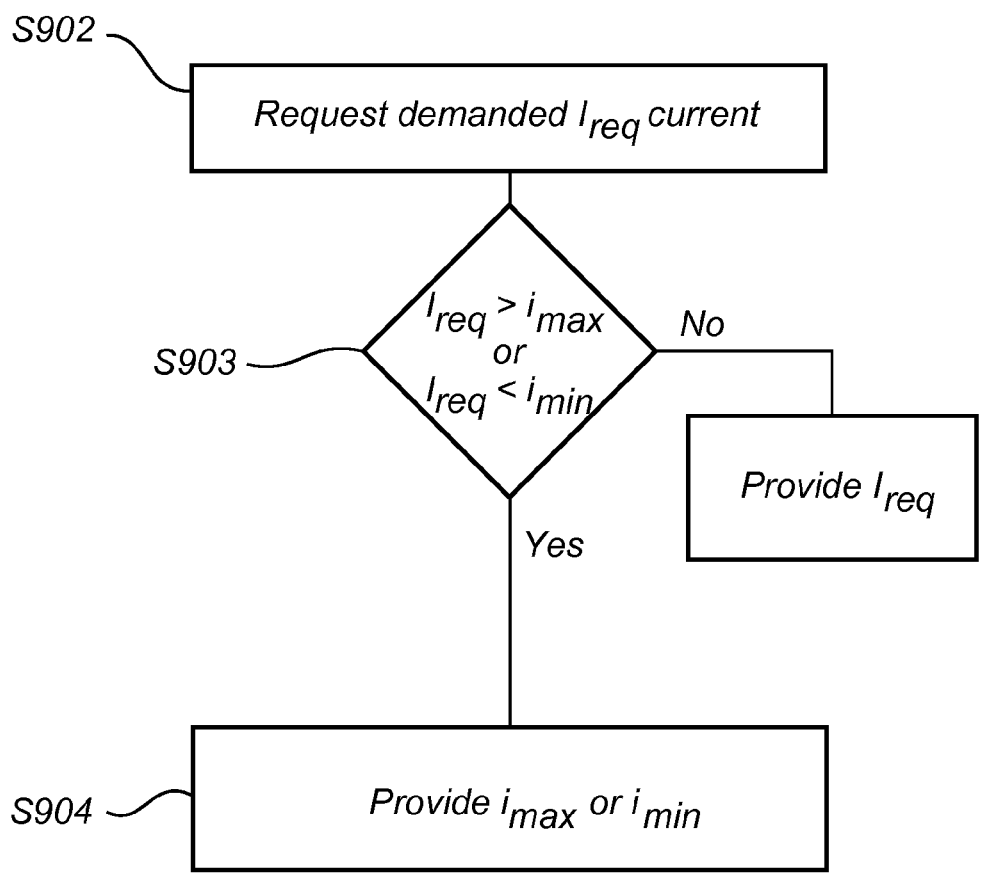
FIG. 9 is a flow-chart with method steps according to an exemplary embodiment of the disclosure.

FIG. 9 is another flow-chart according to an embodiment relating to controlling an electrical charge current of an electrical discharge current of an energy storage device. In a first step S902, requesting a demanded electrical charge current or a demanded electrical discharge current from the energy storage cell. If the demanded electrical charge current is larger than the maximum electrical charge current, providing S904 the maximum electrical charge current, or, wherein, if the demanded electrical discharge current is larger than the maximum electrical discharge current, providing S904 the maximum electrical discharge current. Note that in the discharge case, "larger" means more negative, in other words (mathematically) if $I_{req}<i_{min}$ then the maximum electrical discharge current $i_{min}$ will be withdrawn. Alternatively, in the discharge case, if $|I_{req}|>|i_{min}|$, then the maximum electrical discharge current $i_{min}$ will be withdrawn. Furthermore, the comparison of the demanded current $I_{req}$ with the maximum electrical charge current ($i_{max}$) or the maximum electrical discharge current ($i_{min}$) may comprise comparing with more constraints. The actual applied charge current may be given by:

I(t)=min($I_{req}$,$i_{max}$,$I_{lim,c}$,$I_{SOC}$, . . . ) where $I_{lim,c}$ is a charge current limit preset depending on current limitations of the energy storage device itself, for example the maximum capacity of the energy storage device, and $I_{SOC}$ is a current limit set by the present state of charge of the energy storage cell or energy storage device. Corresponding current limits exist for the discharge case (e.g. $I_{lim,d}$ 514 in FIG. 5b).

Additionally, variations to the disclosed embodiments can be understood and effected by the skilled person in practicing the claimed disclosure, from a study of the drawings, the disclosure, and the appended claims. For example, the method works equally well for determining a maximum charge power or maximum discharge power for an energy storage cell. The maximum charge power may be found from the formula Power$_{max}$=Voltage*$i_{max}$ and the maximum discharge power may be found from Power$_{min}$=Voltage*$i_{min}$.

Furthermore, there may be temperature sensors arranged on the energy storage cell 103 or on the energy storage device 102 for measuring the temperature of the energy storage cell. The temperature measurement may be used for determining relevant energy storage cell parameters such as $R_0$, $R_1$, $C_1$, etc.

Moreover, the models described herein may be implemented in a time-discrete or a time continuous mode or a combination thereof. For example, the estimation of $\hat{v}_1$ may be done in a time-discrete way and the prediction of the voltage of the energy storage cell at the time horizon may be done in a time continuous way.

The system may further comprise electrical components such as relays and converters for controlling the power to and from the energy storage device.

In the claims, the word "comprising" does not exclude other elements or steps, and the indefinite article "a" or "an" does not exclude a plurality. The mere fact that certain measures are recited in mutually different dependent claims does not indicate that a combination of these measured cannot be used to advantage.

While exemplary embodiments are described above, it is not intended that these embodiments describe all possible forms of the disclosure. Rather, the words used in the specification are words of description rather than limitation, and it is understood that various changes may be made without departing from the spirit and scope of the disclosure. Additionally, the features of various implementing embodiments may be combined to form further embodiments of the disclosure.

What is claimed is:

1. A method for controlling an energy storage cell, the method comprising:
   (a) providing a predetermined upper voltage limit or lower voltage limit of the energy storage cell;
   (b) providing a time horizon as a time difference from a present time to a future time;
   wherein, with a repetition time period independent from the time horizon, repeating the following steps:
   (c) measuring a present voltage level of the energy storage cell;
   (d) calculating, by a control unit, a voltage difference between the present voltage level and the upper voltage limit or the lower voltage limit; and
   (e) based on the voltage difference, the time horizon, and an equivalent circuit model comprising a capacitance and a resistance of the energy storage cell relating an electrical charge current or an electrical discharge current to a respective estimated voltage of the energy storage cell, determining, by the control unit, a maximum electrical charge current or a maximum electrical discharge current of the energy storage cell corresponding to the voltage difference, wherein the respective estimated voltage of the energy storage cell is less than or equal to the upper voltage limit during the time horizon in the case of an electrical charge current, or larger than or equal to the lower voltage limit during the time horizon in the case of an electrical discharge current; and
   the method further comprising,
   (f) receiving at the control unit a request for a demanded electrical charge current or a demanded electrical discharge current for the energy storage cell;
   (g) in response to the demanded electrical charge current being larger than the maximum electrical charge current, the control unit automatically limiting a current delivered to the energy storage cell to the maximum electrical charge current; and
   (h) in response to the demanded electrical discharge current being larger than the maximum electrical discharge current, the control unit automatically limiting a current withdrawn from the energy storage cell to the maximum electrical discharge current;
   wherein the maximum electrical charge current or maximum electrical discharge current ($i_{max}$; $i_{min}$) is given by:

$$i_{max,min} = \frac{\Delta v + R_0 i(t) + \hat{v}_1(t)\left(1 - e^{\frac{-\Delta t}{R_1 C_1}}\right)}{R_0 + R_1\left(1 - e^{\frac{-\Delta t}{R_1 C_1}}\right)},$$

where $R_1$, $C_1$, are the resistance and capacitance of a first RC equivalent circuit and $\hat{v}_1$ is the estimated voltage across the first RC equivalent circuit, $R_0$ is an internal resistance of the energy storage cell, i is the current through the energy storage cell, and t is time; and
wherein $\Delta v$ for the maximum electrical charge current ($i_{max}$) is the difference between the upper voltage limit and the measured voltage, and $\Delta v$ for the maximum electrical discharge current ($i_{min}$) is the difference between the lower voltage limit and the measured voltage.

2. The method according to claim 1 wherein the repetition time period is shorter than the time horizon.

3. The method according to claim 1 wherein the repetition time period and the time horizon overlaps in time.

4. The method according to claim 1 wherein the maximum electrical charging current or maximum electrical discharge current is assumed to be constant in magnitude for the entire time horizon during predicting the estimated voltage from the model of the energy storage cell.

5. The method according to claim 1 wherein the maximum electrical charge current or maximum electrical discharge current ($i_{max}$; $i_{min}$) is given by:

$$i_{max,min} = \frac{\Delta v + R_0 i(t) + \hat{v}_1(t)\left(1 - e^{\frac{-\Delta t}{R_1 C_1}}\right) + \hat{v}_2(t)\left(1 - e^{\frac{-\Delta t}{R_2 C_2}}\right)}{R_0 + R_1\left(1 - e^{\frac{-\Delta t}{R_1 C_1}}\right) + R_2\left(1 - e^{\frac{-\Delta t}{R_2 C_2}}\right)}$$

where $R_1$, $C_1$, are the resistance and capacitance of the first RC equivalent circuit and $\hat{v}_1$ is the estimated voltage across the first RC equivalent circuit, and $R_2$, $C_2$, are the resistance and capacitance of a second RC equivalent circuit and $\hat{v}v_2$ is the estimated voltage across the second RC equivalent circuit of a two RC-circuit model of the energy storage cell, $R_0$ is an internal resistance of the energy storage cell, i is the current through the energy storage cell, and t is time, and
wherein $\Delta v$ for the maximum electrical charge current ($i_{max}$) is the difference between the upper voltage limit and the measured voltage, and $\Delta v$ for the maximum electrical discharge current ($i_{min}$) is the difference between the lower voltage limit and the measured voltage.

6. The method according to claim 1 wherein the maximum electrical charge current or maximum electrical discharge current is further based on a model comprising a convergence factor, wherein a magnitude of the maximum electrical charge current or maximum electrical discharge current depends on the magnitude of the convergence factor.

7. A method for controlling an energy storage cell, the method comprising:
(a) providing a predetermined upper voltage limit or lower voltage limit of the energy storage cell;
(b) providing a time horizon as a time difference from a present time to a future time;
wherein, with a repetition time period independent from the time horizon, repeating the following steps:
(c) measuring a present voltage level of the energy storage cell;
(d) calculating, by a control unit, a voltage difference between the present voltage level and the upper voltage limit or the lower voltage limit; and
(e) based on the voltage difference, the time horizon, and an equivalent circuit model comprising a capacitance and a resistance of the energy storage cell relating an electrical charge current or an electrical discharge current to a respective estimated voltage of the energy storage cell, determining, by the control unit, a maximum electrical charge current or a maximum electrical discharge current of the energy storage cell corresponding to the voltage difference, wherein the respective estimated voltage of the energy storage cell is less than or equal to the upper voltage limit during the time horizon in the case of an electrical charge current, or larger than or equal to the lower voltage limit during the time horizon in the case of an electrical discharge current; and
the method further comprising,
(f) receiving at the control unit a request for a demanded electrical charge current or a demanded electrical discharge current for the energy storage cell;
(g) in response to the demanded electrical charge current being larger than the maximum electrical charge current, the control unit automatically limiting a current delivered to the energy storage cell to the maximum electrical charge current; and
(h) in response to the demanded electrical discharge current being larger than the maximum electrical discharge current, the control unit automatically limiting a current withdrawn from the energy storage cell to the maximum electrical discharge current;
wherein the energy storage cell and a controller are modeled as a feedback control system, wherein the energy storage cell is modeled as a transfer function (G) from change in charge current or change in discharge current to a change in voltage given by:

$$G(s) = R_0 + \frac{R_1}{1 + \tau s},$$

where $R_1$ is an electrical resistance, $R_0$ is the internal electrical resistance of the energy storage cell, and $\tau = R_1 C_1$, where $C_1$ is a capacitance in a RC-circuit model of the energy storage cell, and the controller is a feedback controller comprising an integral action, with a second transfer function from the voltage difference to the maximum electrical charge current or the maximum electrical discharge current.

8. The method according to claim 7 wherein the controller is a PI-controller with a second transfer function (F) given by:

$$F(s) = \frac{1}{R_1\left(1 - e^{-\frac{\Delta t}{R_1 C_1}}\right)}\left(1 + \frac{1}{R_1 C_1 s}\right),$$

where $R_1$ is an electrical resistance and $C_1$ is a capacitance in a RC-circuit model of the energy storage cell, $R_0$ is the internal electrical resistance of the energy storage cell, and $\tau = R_1 C_1$,
wherein the maximum electrical charge current or maximum electrical discharge current is further based on an output of the second transfer function.

9. The method according to claim 8, wherein the convergence factor ($\gamma$) is larger than zero, and wherein, with the convergence factor, the controller F(s) is given by:

$$F(s) = \frac{1}{R_1\left(1 - e^{\frac{\Delta t}{R_1 C_1}}\right)}\left(1 + \frac{1}{\gamma R_1 C_1 s}\right).$$

10. A system for controlling an energy storage cell, the system comprising:
a control unit; and
a voltage measuring device;
wherein the control unit is configured to,
(a) receive a predetermined upper voltage limit or lower voltage limit of the energy storage cell;
wherein, with a repetition time period independent from a predetermined time horizon being a time difference from a present time to a future time, the control unit is configured to repeat the following,
(b) receive, from the voltage measuring device, a measurement of a present voltage level of the energy storage cell;
(c) calculate a voltage difference between the present voltage level and the upper voltage limit or the lower voltage limit;
(d) based on the voltage difference, the time horizon, and an equivalent circuit model comprising a capacitance and a resistance of the energy storage cell relating an electrical charge current or an electrical discharge current to a respective estimated voltage of the energy storage cell, determine a maximum electrical charge current or a maximum electrical discharge current of the energy storage cell corresponding to the voltage difference, wherein the respective estimated voltage of the energy storage cell is less than or equal to the upper voltage limit during the time horizon in the case of an electrical charge current, or larger than or equal to the lower voltage limit during the time horizon in the case of an electrical discharge current,
wherein the control unit is further configured to,
(e) receive a request for a demanded electrical charge current or a demanded electrical discharge current for the energy storage cell;
(f) in response to the demanded electrical charge current being larger than the maximum electrical charge current, automatically limit a current delivered to the energy storage cell to the maximum electrical charge current; and (g) in response to the demanded electrical discharge current being larger than the maximum electrical discharge current, automatically limit a current withdrawn from the energy storage cell to the maximum electrical discharge current;

wherein the maximum electrical charge current or maximum electrical discharge current ($i_{max}$; $i_{min}$) is given by:

$$i_{max,min} = \frac{\Delta v + R_0 i(t) + \hat{v}_1(t)\left(1 - e^{\frac{-\Delta t}{R_1 C_1}}\right)}{R_0 + R_1\left(1 - e^{\frac{-\Delta t}{R_1 C_1}}\right)},$$

where $R_1$, $C_1$, are the resistance and capacitance of a first RC equivalent circuit and $\hat{v}_1$ is the estimated voltage across the first RC equivalent circuit, $R_0$ is an internal resistance of the energy storage cell, i is the current through the energy storage cell, and t is time; and wherein $\Delta v$ for the maximum electrical charge current ($i_{max}$) is the difference between the upper voltage limit and the measured voltage, and $\Delta v$ for the maximum electrical discharge current ($i_{min}$) is the difference between the lower voltage limit and the measured voltage.

11. The system according to claim 10 wherein the control unit is partially configured as a feedback controller with integral action such that in response to the demanded current being larger than the maximum electrical charge current or the maximum electrical discharge current, the applied current is determined as the output of a feedback controller, with integral action, and having the voltage difference as reference input.

12. The system according to claim 11 wherein the controller is a PI-controller with a transfer function (F) given by:

$$F(s) = \frac{1}{R_1\left(1 - e^{-\frac{\Delta t}{R_1 C_1}}\right)}\left(1 + \frac{1}{\gamma R_1 C_1 s}\right),$$

where $R_1$ is an electrical resistance and $C_1$ is a capacitance in a RC-circuit model of the energy storage battery, and $\gamma$ is a parameter between 0 and 1, wherein the maximum electrical charge current or the maximum electrical discharge current is further based on the output provided by the transfer function.

13. The system according to claim 10 arranged in a vehicle.

* * * * *

UNITED STATES PATENT AND TRADEMARK OFFICE
CERTIFICATE OF CORRECTION

PATENT NO. : 10,330,731 B2
APPLICATION NO. : 14/932014
DATED : June 25, 2019
INVENTOR(S) : Hannes Kuusisto et al.

It is certified that error appears in the above-identified patent and that said Letters Patent is hereby corrected as shown below:

In the Claims

Column 16, Line 59, Claim 5:
After "equivalent circuit and"
Delete "$\hat{v}v_2$"
And insert -- $\hat{v}_2$ --.

Signed and Sealed this
Seventeenth Day of December, 2019

Andrei Iancu
*Director of the United States Patent and Trademark Office*